(12) United States Patent
Toyota et al.

(10) Patent No.: US 9,263,642 B2
(45) Date of Patent: Feb. 16, 2016

(54) III NITRIDE SEMICONDUCTOR LIGHT EMITTING DEVICE AND METHOD FOR MANUFACTURING THE SAME

(75) Inventors: Tatsunori Toyota, Tokyo (JP); Tomohiko Shibata, Tokyo (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 0 days.

(21) Appl. No.: 13/825,888

(22) PCT Filed: Sep. 30, 2011

(86) PCT No.: PCT/JP2011/005558
§ 371 (c)(1),
(2), (4) Date: Mar. 25, 2013

(87) PCT Pub. No.: WO2012/042909
PCT Pub. Date: Apr. 5, 2012

(65) Prior Publication Data
US 2013/0193471 A1    Aug. 1, 2013

(30) Foreign Application Priority Data

Sep. 30, 2010    (JP) ................................ 2010-222728

(51) Int. Cl.
*H01L 33/00*    (2010.01)
*H01L 33/40*    (2010.01)
(Continued)

(52) U.S. Cl.
CPC ............ *H01L 33/405* (2013.01); *H01L 33/382* (2013.01); *H01L 33/32* (2013.01); *H01L 33/387* (2013.01); *H01L 2933/0016* (2013.01)

(58) Field of Classification Search
CPC ............ H01L 33/0062; H01L 33/0075; H01L 33/387; H01L 33/405; H01L 33/62
USPC ................ 257/91, 98–99; 438/29, 39, 42, 46
See application file for complete search history.

(56) References Cited

U.S. PATENT DOCUMENTS 7,049,635 B2 *   5/2006   Sano et al. ........................ 257/79
7,235,818 B2 *   6/2007   Kim et al. ........................ 257/98
(Continued)

FOREIGN PATENT DOCUMENTS

EP        2187456 A2      5/2010
JP       A-11-214744      8/1999
(Continued)

OTHER PUBLICATIONS

International Preliminary Report on Patentability Issued in Application No. PCT/JP2011/005558; Dated Apr. 30, 2013.
(Continued)

*Primary Examiner* — Benjamin Sandvik
*Assistant Examiner* — Herve Assouman
(74) *Attorney, Agent, or Firm* — Oliff PLC

(57) ABSTRACT

A III nitride semiconductor light emitting device with improved light emission efficiency achieved without significantly increasing forward voltage by achieving both good ohmic contact between an electrode and a semiconductor layer, and sufficient functionality of a reflective electrode layer, and a method for manufacturing the same. The III nitride semiconductor light emitting device has a III nitride semiconductor laminate including an n-type semiconductor layer, a light emitting layer, and a p-type semiconductor layer; an n-side electrode, a p-side electrode; and a composite layer having a reflective electrode portion and a contact portion made of $Al_xGa_{1-x}N$ ($0 \le x \le 0.05$) on a second surface of the III nitride semiconductor laminate. The second surface is opposite to a first surface on the light extraction side.

13 Claims, 6 Drawing Sheets

(51) Int. Cl.
*H01L 33/38* (2010.01)
*H01L 33/32* (2010.01)

(56) References Cited

U.S. PATENT DOCUMENTS

| | | | |
|---|---|---|---|
| 7,375,367 B2* | 5/2008 | Hooper | B82Y 20/00 257/13 |
| 7,411,220 B2* | 8/2008 | Horio et al. | 257/79 |
| 2004/0021147 A1 | 2/2004 | Ishibashi et al. | |
| 2004/0119082 A1 | 6/2004 | Sugawara | |
| 2004/0119085 A1 | 6/2004 | Bader et al. | |
| 2005/0104081 A1 | 5/2005 | Kim et al. | |
| 2005/0205884 A1* | 9/2005 | Kim | H01L 33/18 257/98 |
| 2006/0289886 A1* | 12/2006 | Sakai | H01L 33/387 257/98 |
| 2008/0048194 A1* | 2/2008 | Kudo | H01L 33/32 257/94 |
| 2008/0064133 A1* | 3/2008 | Lee | H01L 33/46 438/29 |
| 2008/0135868 A1 | 6/2008 | Okagawa et al. | |
| 2008/0142783 A1* | 6/2008 | Emerson et al. | 257/13 |
| 2008/0246047 A1* | 10/2008 | Hsu | H01L 33/387 257/98 |
| 2009/0272994 A1 | 11/2009 | Lim | |
| 2010/0044734 A1* | 2/2010 | Seko | H01L 33/0079 257/98 |
| 2010/0059760 A1* | 3/2010 | Miki | 257/76 |

FOREIGN PATENT DOCUMENTS

| | | |
|---|---|---|
| JP | A-2001-257429 | 9/2001 |
| JP | A-2001-291930 | 10/2001 |
| JP | A-2004-031990 | 1/2004 |
| JP | A-2004-119983 | 4/2004 |
| JP | A-2004-200431 | 7/2004 |
| JP | A-2006-253240 | 9/2006 |
| JP | A-2007-027510 | 2/2007 |
| JP | A-2007-158131 | 6/2007 |
| JP | A-2008-159980 | 7/2008 |
| WO | WO 03/098710 A1 | 11/2003 |

OTHER PUBLICATIONS

Mar. 25, 2014 Notice of Preliminary Rejection issued in Korean Patent Application No. 10-2013-7008400 (with English translation).

Oct. 14, 2015 Search Report issued in European Application No. 11828474.4.

Japanese Office Action issued in Application No. 2012-536227; Dated Aug. 20, 2013 (With Translation).

Feb. 28, 2015 Office Action issued in Chinese Application No. 201180047281.0.

International Search Report issued in Application No. PCT/JP2011/005558; Dated Nov. 1, 2011 (With Translation).

Dec. 3, 2013 Office Action issued in Japanese Patent Application No. 2012-536227 (with English translation).

* cited by examiner

III NITRIDE SEMICONDUCTOR LIGHT EMITTING DEVICE AND METHOD FOR MANUFACTURING THE SAME

TECHNICAL FIELD

The present invention relates to a III nitride semiconductor light emitting device and a method for manufacturing the same. The present invention relates in particular to a III nitride semiconductor light emitting device with improved light emission efficiency achieved without significantly increasing forward voltage and a method for manufacturing the same.

BACKGROUND ART

In recent years, ultraviolet LEDs (light emitting diodes) which emit light in an ultraviolet region, particularly having a wavelength of less than 365 nm, have attracted attention as LEDs that can be favorably used in the fields of sterilization, water purification, medical treatment, illumination, high-density optical recording, and the like.

Some of such ultraviolet LEDs are known to have a device structure formed using an AlGaN-based thin film, which is a III nitride semiconductor, as a device material. Specifically, the LEDs are III nitride semiconductor light emitting devices each having a III nitride semiconductor laminate including a light emitting layer, and a p-type semiconductor layer and an n-type semiconductor layer which are formed with the light emitting layer therebetween; a p-type electrode on the p-type semiconductor layer side; and an n-type electrode on the n-type semiconductor layer side.

In a known technique for enhancing the light emission efficiency of the light emitting device, a reflective electrode layer is provided between a semiconductor layer and an electrode that are opposite to the light extraction side of the light emitting device (for example, between the p-type semiconductor layer and the p-side electrode when the n-type electrode side is the light extraction side)(see JP 2007-158131 A and JP 2007-027540 A (PTLs 1 and 2)). The reflective electrode layer reflects part of light produced in the light emitting layer, which is directed toward the p-side electrode, thus increasing the amount of light emitted out from the light extraction side. For example, PTL 1 discloses a III nitride semiconductor light emitting device having a reflectance enhanced by forming a rhodium (Rh) layer or the like as a high reflectance electrode layer on the p-type semiconductor layer.

CITATION LIST

Patent Literature

PTL 1: JP 2007-158131 A
PTL 2: JP 2007-027540 A

SUMMARY OF INVENTION

Technical Problem

The properties of a III nitride semiconductor light emitting device include for example light emission efficiency and forward voltage. It is important to improve these properties in a balanced manner.

In a case of the light emitting device in which a reflective electrode layer is formed, contact resistance between the reflective electrode layer and a p-type semiconductor layer made of an AlGaN-based thin film is high, which makes it difficult to obtain good ohmic contact. Therefore, even if the reflectance of the light produced in the light emitting layer with the use of the reflective electrode layer, sufficient carriers cannot ever be produced; sufficient emission efficiency cannot be achieved as a whole; in addition, forward voltage is increased, which are problems.

In view of the above, the inventors of the present invention examined the properties of a device in which a p-type contact layer made of an AlGaN layer having low Al content or a GaN layer without containing Al is formed on the p-type semiconductor layer made of an AlGaN-based thin film, and a p-side electrode is formed thereon. This p-type contact layer is well lattice matched to the p-type semiconductor layer. Further, contact resistance can be reduced when this p-type contact layer is in contact with the p-side electrode as compared with the case where the p-type semiconductor layer is directly in contact with the p-side electrode. Thus, good ohmic contact can be obtained.

However, the contact layer characteristically absorbs ultraviolet light, in particular, light at a wavelength of 365 nm or less. In existing general light emitting devices emitting visible light, the visible light is not absorbed by a contact layer but is reflected by a reflective electrode layer. Thus, high reflectance can be obtained while obtaining good ohmic contact. However, as with the above described ultraviolet LEDs attracting attention in recent years, in a III nitride semiconductor light emitting device having a light emitting layer producing light at a wavelength shorter than the wavelength of 365 nm, for example 350 nm or less, the light produced in the light emitting layer is absorbed by the p-type contact layer before the light reaches the reflective electrode layer. The inventors of the present invention found, from the above examination about a light emitting device provided with a p-type contact layer, that the function of a reflective electrode layer cannot be fully achieved even if good ohmic contact can be formed between an electrode and a semiconductor layer, and as a result, the light emission efficiency is reduced as a whole.

In view of the above problems, it is an object of the present invention to provide a III nitride semiconductor light emitting device with improved light emission efficiency achieved without significantly increasing forward voltage by achieving both good ohmic contact between an electrode and a semiconductor layer, and sufficient functionality of a reflective electrode layer. It is another object of the present invention to provide a method for manufacturing such a III nitride semiconductor light emitting device.

Solution to Problem

Taking the above problems into consideration, primary features of the present invention are as follows.

(1) A III nitride semiconductor light emitting device comprising:
a III nitride semiconductor laminate including a light emitting layer, and a first conductivity-type semiconductor layer and a second conductivity-type semiconductor layer having a conductivity type different from the first conductivity type, the light emitting layer being sandwiched between the first conductivity type semiconductor layer and the second conductivity type semiconductor layer; and
a first electrode and a second electrode formed on the first conductivity-type semiconductor layer side and the second conductivity-type semiconductor layer side of the III nitride semiconductor laminate, respectively,
wherein a composite layer having a reflective electrode portion and a contact portion made of $Al_xGa_{1-x}N$ ($0 \leq x \leq 0.05$) is provided on a second surface of the III nitride semiconductor laminate, the second surface being opposite to a first surface on light extraction side.

(2) The III nitride semiconductor light emitting device according to (1) above, wherein in the composite layer, at least one of the reflective electrode portion and the contact portion is provided to form a plurality of island-shaped regions on the second surface, and the other of reflective electrode portion and the contact portion is provided to be positioned at least between the plurality of the island-shaped regions.

(3) The III nitride semiconductor light emitting device according to (1) above or (2) above, wherein the semiconductor layer having the second surface is p-type, and the reflective electrode portion is made of one of Rh, Pt, Ir, Ru, and Mo or an alloy containing any of these.

(4) The III nitride semiconductor light emitting device according to any one of (1) to (3) above, wherein one of the first electrode and the second electrode, which is located at the second surface side, is formed on the reflective electrode portion and/or the contact portion.

(5) The III nitride semiconductor light emitting device according to any one of (1) to (4) above, wherein the second surface of the III nitride semiconductor laminate is a part of a semiconductor layer made of $Al_xGa_{1-x}N$ ($0 \leq x \leq 0.05$) with a thickness of 5 nm or less.

(6) The III nitride semiconductor light emitting device according to any one of (1) to (5) above, wherein the contact portion is thicker than the reflective electrode portion.

(7) The III nitride semiconductor light emitting device according to (6) above, wherein the contact portion is formed to cover the reflective electrode portion.

(8) A method for manufacturing a III nitride semiconductor light emitting device, comprising the steps of:

forming a buffer layer on a substrate;

forming a III nitride semiconductor laminate by sequentially forming a first conductivity-type semiconductor layer, a light emitting layer, and a second conductivity-type semiconductor layer having a conductivity type different from the first conductivity type, on the buffer layer;

forming a reflective electrode portion on a first region of a surface of the III nitride semiconductor laminate on the second conductivity-type semiconductor layer side;

forming a contact portion made of $Al_xGa_{1-x}N$ ($0 \leq x \leq 0.05$) at least on a second region other than the first region; and forming a first electrode and a second electrode on the III nitride semiconductor laminate on the first conductivity-type semiconductor layer side and the second conductivity-type semiconductor layer side, respectively.

(9) The method for manufacturing a III nitride semiconductor light emitting device according to (8) above, further comprising a step of forming a semiconductor layer made of $Al_xGa_{1-x}N$ ($0 \leq x \leq 0.05$) to a thickness of 5 nm or less on a surface of the III nitride semiconductor laminate, on which the reflective electrode portion and the contact portion are formed.

(10) The method for manufacturing a III nitride semiconductor light emitting device according to (8) above or (9) above, further comprising the step of:

providing a protective layer on the reflective electrode portion after the step of forming the reflective electrode portion;

then forming the contact layer, and then removing the protective layer.

Advantageous Effect of Invention

According to the present invention, a composite layer having an reflective electrode portion and a contact portion is formed on a surface of a III nitride semiconductor laminate, opposite to the light extraction side, so that both good ohmic contact between an electrode and a semiconductor layer, and sufficient functionality of the reflective electrode portion can be achieved. Thus, the light emission efficiency can be improved without significantly increasing forward voltage.

DESCRIPTION OF EMBODIMENTS

Figure 1:
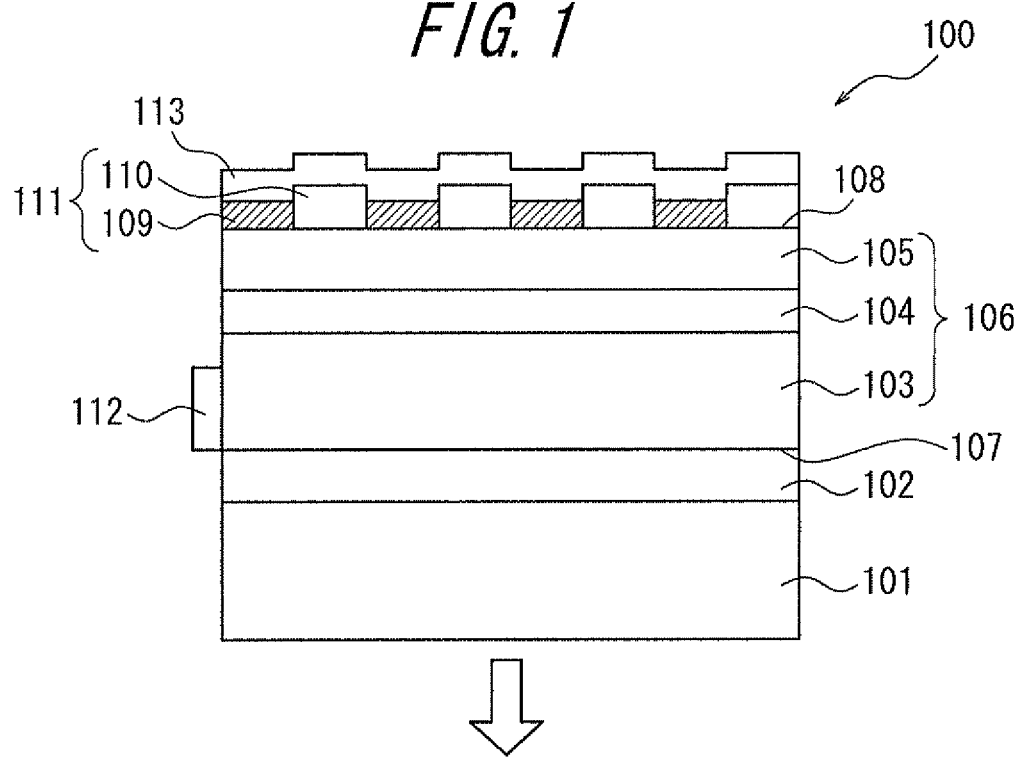
FIG. 1 is a schematic cross-sectional view of a III nitride semiconductor light emitting device 100 (Embodiment 1) according to the present invention.

The present invention will be described below in more detail with reference to the accompanying drawings. In principle, components that are common to different embodiments are denoted by reference numerals having the same two last digits, and thus their descriptions will be omitted. Further, in the schematic cross-sectional views of light emitting devices, each layer is enlarged for the sake of explanation; accordingly, the ratio of the illustrated layers to the illustrated substrate does not conform to the actual ratio.

(Embodiment 1)

The III nitride semiconductor light emitting device 100, which is an embodiment of the present invention, includes a buffer layer 102, a III nitride semiconductor laminate 106, and a composite layer 111 having a reflective electrode portion 109 and a contact portion 110 in this order on a substrate 101 as shown in FIG. 1.

The III nitride semiconductor laminate 106 includes a light emitting layer 104, an n-type semiconductor layer 103 as a first conductivity-type semiconductor layer, and a p-type semiconductor layer 105 as a second conductivity-type semiconductor layer. The second conductivity type is different from the first conductivity type. The light emitting layer 104 is sandwiched between the n-type semiconductor layer 103 and the p-type semiconductor layer 105. In this embodiment, the n-type semiconductor layer 103, the light emitting layer 104, and the p-type semiconductor layer 105 are formed in this order from the buffer layer 102 side.

An n-side electrode 112 as a first electrode is formed on the n-type semiconductor layer 103 side of the III nitride semiconductor laminate 106. FIG. 1 schematically shows that the n-side electrode 112 is electrically connected to the n-type semiconductor layer 103. However, typically, the composite layer 111 and the III nitride semiconductor laminate 106 are partially removed to expose a surface of the n-type semiconductor layer 103, and the n-side electrode is provided on the exposed n-type semiconductor layer 103. Such a device is generally referred to as a "lateral" light emitting device. A p-side electrode 113 as a second electrode is formed on the p-type semiconductor layer 105 side of the III nitride semiconductor laminate 106, and is electrically connected to the p-type semiconductor layer 105 via the composite layer 111 in this embodiment.

A substrate used as the substrate 101 is preferably resistant to the temperature of epitaxial growth of the III nitride semiconductor laminate 106. For example, a sapphire substrate or an AlN template in which an AlN single crystal layer is formed on a substrate made of sapphire or the like can be used.

For the buffer layer 102, a layer made of AlN having a thickness of 20 nm to 1500 nm, preferably 500 nm to 1500 nm, more preferably 800 nm to 1000 nm can be used. The AlN layer is epitaxially grown on the substrate 101 by a known method such as MOCVD, MOVPE, HVPE, and MBE. The buffer layer 102 serves as a strain buffer layer for preventing strains between the substrate 101 and the n-type semiconductor layer 103. Alternatively, the buffer layer 102 may be a superlattice strain buffer layer used in examples to be described later.

The n-type semiconductor layer 103 and the p-type semiconductor layer 105 can be formed by epitaxially growing $Al_xGa_{1-x}N$ material ($0<x\leq1$) using a known method such as MOCVD. Unless absorption of light at the desired emission wavelength causes a problem, they may contain B or In as a Group III element, and As as a Group V element. Examples of p-type impurities include Be and Mg, whereas examples of n-type impurities include Si and Ge. The light emitting layer 104 can be formed by growing an AlInGaN/AlInGaN multiple quantum-well structure by MOCVD or the like. The thickness of the n-type semiconductor layer 103 may be 1000 nm to 5000 nm, the light emitting layer 104: 10 nm to 100 nm, the p-type semiconductor layer 105: 50 nm to 300 nm, for example.

Here, the composite layer 111 which is a characteristic feature of the present invention will be described. First, the reflective electrode portion 109 is formed on a first region of a second surface 108 of the III nitride semiconductor laminate 106. The second surface 108 is opposite to a first surface 107 on the light extraction side (arrow in FIG. 1). The material of the reflective electrode portion 109 is not limited in particular as long as it is a metal having high reflectivity (for example, 60% or higher) for ultraviolet light (at a wavelength of 200 nm to 350 nm) produced in the light emitting layer 104. The examples of the metal include, for example, rhodium (Rh), platinum (Pt), iridium (Ir), ruthenium (Ru), molybdenum (Mo), tungsten (W), tantalum (Ta), and an alloy containing any of these metals. Of these, Rh, Ru, and Mo are preferable.

Figure 2:
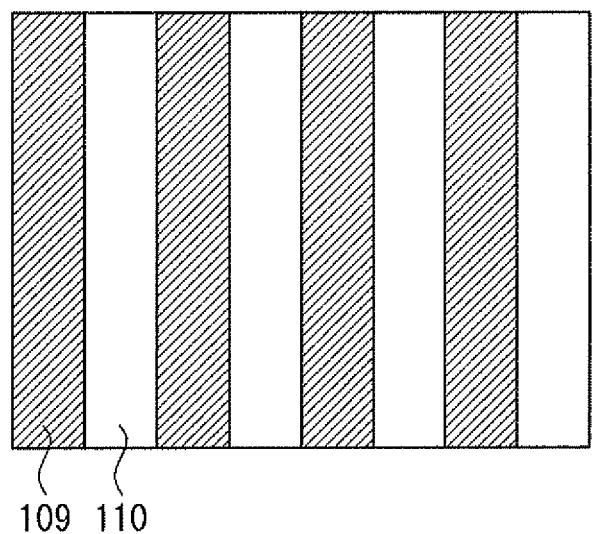
FIG. 2 is a top view of the III nitride semiconductor light emitting device shown in FIG. 1, in which a p-side electrode 113 is removed, for illustrating the positional relationship between a reflective electrode portion 109 and a contact portion 110.

Meanwhile, the contact portion 110 made of $Al_xGa_{1-x}N$ ($0\leq x\leq0.05$) is formed on a second region other than the first region of the second surface 108 on which the reflective electrode portion 109 has been formed. In this embodiment, as shown in FIG. 1 and FIG. 2, the reflective electrode portion 109 is formed to have a plurality of rows of electrodes in a striped pattern. The contact portion 110 is formed to have a plurality of rows of contacts in a striped pattern so as to bridge the gaps between the electrodes. In other words, the reflective electrode portion and the contact portion are formed such that the linear electrodes and contacts are alternately formed (in an alternate stripe pattern). In this embodiment, the contact portion 110 has low or no Al content. Accordingly, the contact portion 110 is well lattice matched to the p-type semiconductor layer 105. Meanwhile, the contact resistance between the contact portion 110 and the p-side electrode 113 is lower than that between the p-type semiconductor layer 105 and the p-side electrode 113. Further, the contact portion 110 has the same conductivity type as a semiconductor layer having a second surface. In this embodiment, since the p-type semiconductor layer 105 has the second surface 108, the contact portion 110 has p-type conductivity. In cases of $x>0.05$, excessive Al content significantly reduces carrier density. Therefore, x is set such that $0\leq x\leq0.05$ holds in the present invention.

In the first region of the second surface 108 on which the reflective electrode portion 109 is formed, $Al_xGa_{1-x}N$ ($0\leq x\leq0.05$) forming the contact portion 110 hardly absorbs ultraviolet light produced in the light emitting layer 104 and the reflective electrode portion 109 can reflect the ultraviolet light. Meanwhile, good ohmic contact can be obtained between the contact portion 110 formed on the second region of the second surface 108 and the p-side electrode 113. In the present invention as described above, the composite layer 111 having the reflective electrode portion 109 and the contact portion 110 is formed on the second surface 108 opposite to the light extraction side. Thus, both good ohmic contact between an electrode and a semiconductor layer and sufficient functionality of a reflective electrode layer can be achieved. As a result, the light emission efficiency can be improved without significantly increasing the forward voltage.

Here, the positional relationship between the reflective electrode portion 109 and the contact portion 110 is not limited in particular to that shown in FIG. 2 as long as both of them are on the second surface 108.

For example, the composite layer 111 is provided such that at least one of the reflective electrode portion 109 and the contact portion 110 is provided to form a plurality of island-shaped regions on the second surface 108, and the other of the two is provided to be positioned at least between the plurality of the island-shaped regions. Examples of a structure in which the contact portion 110 forms a plurality of island-shaped regions include a structure in which openings having a predetermined shape, e.g. a rectangular or circular shape viewed from above as with FIG. 2, are located in a regular or irregular manner in the reflective electrode portion 109, and the openings are bridged by the contact portion. Examples of a structure in which the reflective electrode portion 109 forms a plurality of island-shaped regions include a structure in which, the island-shaped regions having a predetermined shape, e.g. a rectangular or circular shape viewed from above as with FIG. 2, are located in a regular or irregular manner, and the gaps between the island-shaped regions are bridged by the contact portion. In the striped structure shown in FIG. 2, both the reflective electrode portion 109 and the contact portion 110 are provided to form a plurality of island-shaped regions, and they are arranged such that the gaps between the island-shaped regions of one of the two are bridged by the plurality of island-shaped regions of the other. Examples of such a structure also include a structure in which the reflective electrode portion 109 and the contact portion 110 form a checkerboard pattern viewed from above as with FIG. 2.

Here, in terms of more sufficiently achieving both good ohmic contact and high light reflectance, S1/S2: the ratio of area S1 of the first region of the second surface on which the reflective electrode portion is formed to area S2 of the second region on which the contact portion is formed, is preferably in the range of 0.1 to 10, more preferably in the range of 0.25 to 1.5. The S1/S2 ratio of 0.1 or more does not result in insufficient reflection efficiency of the reflective electrode portion 109 with respect to light. Meanwhile, the S1/S2 ratio of 10 or less does not lead to poor ohmic contact between the electrode and the semiconductor layer.

Here, transfer of carriers on the p-side will be described. Carriers transferred from the p-side electrode 113 to the contact portion 110 are directly transferred to the p-type semiconductor layer 105. Meanwhile, carriers transferred from the p-side electrode 113 to the reflective electrode portion 109 are first transferred preferentially to the contact portion 110 and then to the p-type semiconductor layer 105, since the barrier between the reflective electrode portion 109 and the adjacent contact portion 110 is lower for the carrier transfer than the barrier between the reflective electrode portion 109 and the p-type semiconductor layer 105. However, some of the carriers are considered to be directly transferred to the p-type semiconductor layer 105 from the reflective electrode portion 109; therefore, the reflective electrode portion 109 does not serve as a so-called current blocking layer.

In this embodiment, since the semiconductor layer having the second surface 108 is p-type, the reflective electrode portion is preferably made of one of Rh, Pt, Ir, Ru, and Mo or an alloy containing any of these elements. These metals can form a relatively good ohmic contact with the p-type semiconductor layer 105. Accordingly, good ohmic contact between the p-type semiconductor layer 105 and not only the contact portion 110 but also the reflective electrode portion 109 can be formed, thereby improving the carrier density. Further, these metals are also preferable in that, in the step of forming the contact portion 110 after forming the reflective electrode portion 109, the metals are less likely to diffuse into the p-type semiconductor layer 105, so that dislocations are less likely to occur in the p-type semiconductor layer 105.

As in this embodiment, the contact portion 110 is preferably thicker than the reflective electrode portion 109. The formation of a thick contact portion 110 allows a sufficient amount of holes to be supplied. The film thickness of the reflective electrode portion 109 is preferably in the range of 5 nm to 200 nm. The reflective electrode portion 109 having a film thickness of 5 nm or more can reflect ultraviolet light produced in the light emitting layer 104 more reliably. On the other hand, the reflective electrode portion 109 having a film thickness of 200 nm or less prevents strain generated in the reflective electrode portion from affecting the device. The film thickness of the contact portion 110 is preferably in the range of 20 nm to 300 nm. The contact portion having a film thickness of 20 nm or more can supply a sufficient amount of holes, whereas the holes can be sufficiently activated by electron beam irradiation or annealing as long as the film thickness is 300 nm or less. The contact portion 110 may cover a part or the entire of the upper surface of the reflective electrode portion 109.

For the n-side electrode 112, a Ti/Al electrode in which a Ti-containing film and an Al-containing film are sequentially deposited for example by vacuum deposition can be used, for the reason that contact resistance between such an electrode and the n-type semiconductor layer 103 is low. For example, a Ni/Au electrode in which a Ni-containing film and a Au-containing film are sequentially deposited by vacuum deposition and a Ni/Pt electrode can be used as the p-side electrode 113, since contact resistance between such electrodes and the p-type semiconductor layer 105 is low.

The p-side electrode 113, which is located on the second surface 108 side, is preferably formed directly on the reflective electrode portion 109 and the contact portion 110 (composite layer 111) as in this embodiment.

Further, the second surface 108 of the III nitride semiconductor laminate 106, that is, the surface of the second conductivity-type semiconductor layer 105 is preferably constituted by an $Al_xGa_{1-x}N$ ($0 \leq x \leq 0.05$) semiconductor layer having a thickness of 5 nm or less. In other words, in this embodiment, the top layer of the p-type semiconductor layer 105 is the foregoing semiconductor layer. After forming the p-type semiconductor layer 105, the substrate is once removed from a film deposition furnace before forming the reflective electrode portion 109. Therefore, Al in the p-type semiconductor layer 105 is oxidized, which would affect crystal growth of the contact portion 110. However, the formation of the foregoing semiconductor layer can suppress oxidation of Al. The thickness is set to 5 nm or less, since when the semiconductor layer is provided in a thickness exceeding 5 nm, ultraviolet light produced in the light emitting layer 104 is absorbed by the semiconductor layer, which results in lower light emission efficiency.

In the present invention, but without limitation, the aforementioned III nitride semiconductor light emitting device 100 has the first conductivity type being n-type and the second conductivity type being p-type. Alternatively, the first conductivity type and the second conductivity type can naturally be p-type and n-type, respectively in the present invention. On this occasion, the material of the reflective electrode portion 109 is preferably a metal such as Ti/Al, Mo/Al, or W/Al, since relatively good ohmic contact can be formed between those metals and n-AlGaN forming an n-type semiconductor layer.

(Manufacturing Method)

Figure 3:
FIGS. 3(a) to 3(g) are schematic cross-sectional views illustrating an example of a production process of a III nitride semiconductor light emitting device 100 according to the present invention.
Figure 3:
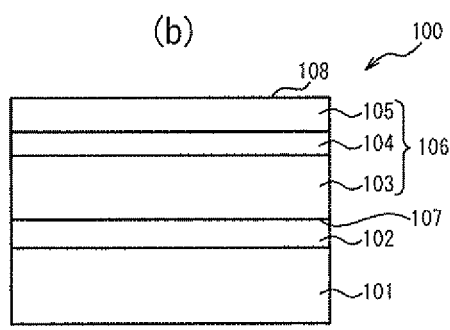
Figure 3:
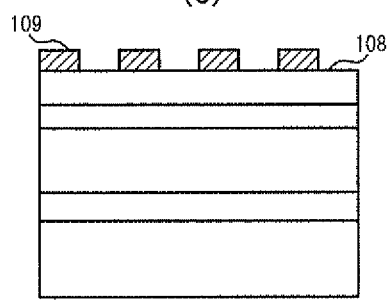
Figure 3:
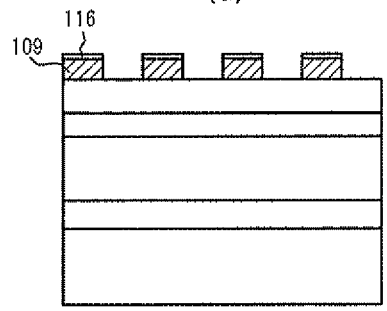
Figure 3:
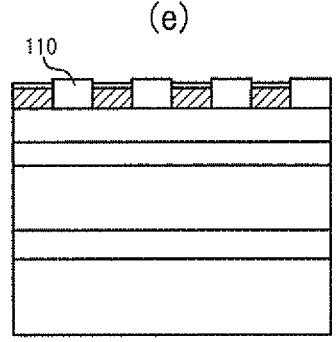
Figure 3:
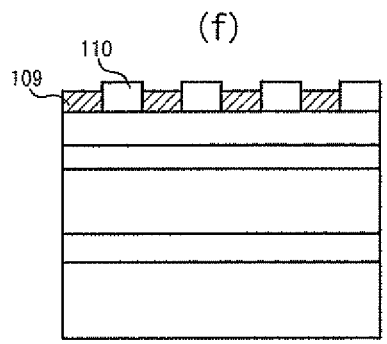
Figure 3:
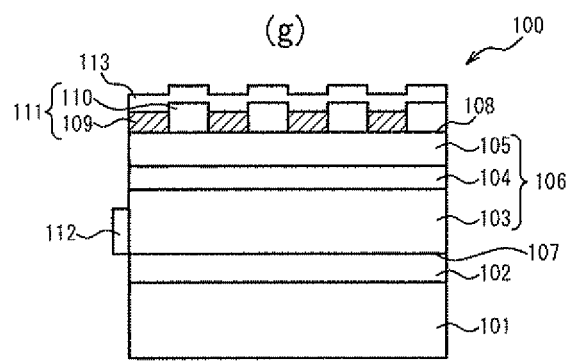

Next, an example of a method for manufacturing a III nitride semiconductor light emitting device 100 will be described with reference to FIGS. 3(a) to 3(g). First, as shown in FIG. 3(a), a buffer layer 102 made of AlN is formed on a substrate 101 for example by MOCVD. Next, as shown in FIG. 3(b), a semiconductor layer 103 of n-type (first conductivity type), a light emitting layer 104, and a semiconductor layer 105 of p-type (second conductivity type different from the first conductivity type) are epitaxially grown in this order on the buffer layer 102 to form a III nitride semiconductor laminate 106. The epitaxial growth can also be performed by MOCVD.

Here, a surface 108, on which a reflective electrode portion and a contact portion are to be provided in subsequent steps, that is, the top layer of the p-type semiconductor layer 105 is preferably constituted by a p-type $Al_xGa_{1-x}N$ ($0 \leq x \leq 0.05$) semiconductor layer having a thickness of 5 nm or less. With this structure, as described above, oxidation of Al in the p-type semiconductor layer 105 can be suppressed when the substrate is removed from the film deposition furnace in the next step.

Next, as shown in FIG. 3(c), a reflective electrode portion 109 is formed on a first region of the surface 108 of the III nitride semiconductor laminate 106 on the p-type semiconductor layer 105 side. The reflective electrode portion 109 can be formed for example by forming a resist having a desired pattern by photolithography; forming a film of a material for forming the reflective electrode portion by sputtering, vacuum deposition, or the like; and then removing the resist.

As long as oxidation of Al in the p-type semiconductor layer 105 can be suppressed, the reflective electrode portion may be formed by forming a metal film, forming a resist on the metal film, and etching the metal film.

Next, as shown in FIG. 3(d), a protective layer 116 is preferably formed on the reflective electrode portion 109. This is to suppress nitridation of the reflective electrode portion 109 due to exposure to ammonia atmosphere when the contact portion is epitaxially grown in the next step. Nitridation of the reflective electrode portion 109 is not preferred because the reflectance of light produced in the light emitting layer 104 is reduced. In this case, the resist used to form the reflective electrode portion 109 is to be removed after forming the protective layer 116. Examples of the material of the protective layer includes but not limited to $SiO_2$ and $SiN_x$ as long as it can prevent change in properties of the reflective electrode portion as described above.

After the protective layer 116 is formed, as shown in FIG. 3(e), a contact portion 110 made of p-type $Al_xGa_{1-x}N$ ($0 \leq x \leq 0.05$) is formed at least on a second region other than the first region for example by MOCVD. After that, as shown in FIG. 3(f), the protective layer 116 is preferably removed using a chemical solution such as BHF, for example.

Subsequently, as shown in FIG. 3(g), an n-side electrode 112 and a p-side electrode 113 are formed on the n-type semiconductor layer 103 side and the p-type semiconductor layer 105 side of the III nitride semiconductor laminate 106, respectively. The n-side electrode 112 can be formed by sputtering or vacuum deposition on a part of a surface of the n-type semiconductor layer 103 which is exposed by partially removing the composite layer 111 and the III nitride semiconductor laminate 106 for example by polishing, wet etching, or the like. The p-side electrode 113 can be formed directly on the composite layer 111 also by sputtering or vacuum deposition. Here, when the reflective electrode portion 109 and the contact portion 110 have different film thicknesses, the surface profile of the p-side electrode 113 is likely to be influenced by the surface irregularities of the composite layer 111 as shown in the drawing.

Thus, the lateral III nitride semiconductor light emitting device 100 can be manufactured.

(Embodiment 2)

A III nitride semiconductor light emitting device 200 which is another embodiment of the present invention will be described with reference to FIG. 4. This embodiment is the same as Embodiment 1 except that a contact portion 210 is thinner than a reflective electrode portion 209 in a composite layer 211. Reference numeral 201 designates a substrate, 202 designates a buffer layer, 203 designates an n-type semiconductor layer, 204 designates a light emitting layer, 205 designates a p-type semiconductor layer, 206 designates a III nitride semiconductor laminate, 212 designates an n-side electrode, and 213 designates a p-side electrode. This embodiment is preferable in terms of reducing the surface resistance of the p-side electrode.

(Embodiment 3)

Figure 5:
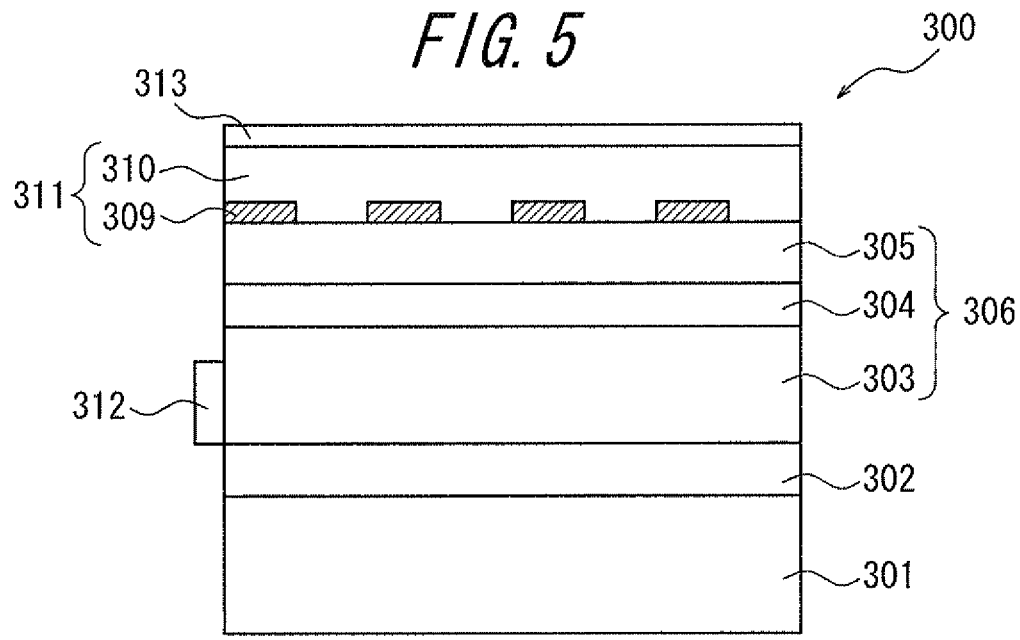
FIG. 5 is a schematic cross-sectional view illustrating another III nitride semiconductor light emitting device 300 (Embodiment 3) according to the present invention.

A III nitride semiconductor light emitting device 300 which is another embodiment of the present invention will be described with reference to FIG. 5. This embodiment is the same as Embodiment 1 except that a contact portion 310 is formed to cover a reflective electrode portion 309 in a composite layer 311. When epitaxial growth of the contact portion 310 is performed for a longer time than in Embodiment 1, the contact portion 310 is laterally grown on the reflective electrode portion 309, thereby forming the contact portion 310 having a flat surface as shown in FIG. 5. The film thickness of a part of the contact portion 310 without the reflective electrode portion 309 is preferably in the range of 100 nm to 500 nm. Reference numeral 301 designates a substrate, 302 designates a buffer layer, 303 designates an n-type semiconductor layer, 304 designates a light emitting layer, 305 designates a p-type semiconductor layer, 306 designates a III nitride semiconductor laminate, 312 designates an n-side electrode, and 313 designates a p-side electrode. In this embodiment, in terms of suppressing nitridation of the reflective electrode portion, it is preferable to form a protective layer (not shown) made of $SiO_2$, $SiN_x$, or the like on the reflective electrode portion 309 after forming the reflective electrode portion 309 and to form the contact portion 310 without removing the protective layer.

(Embodiment 4)

Figure 6:
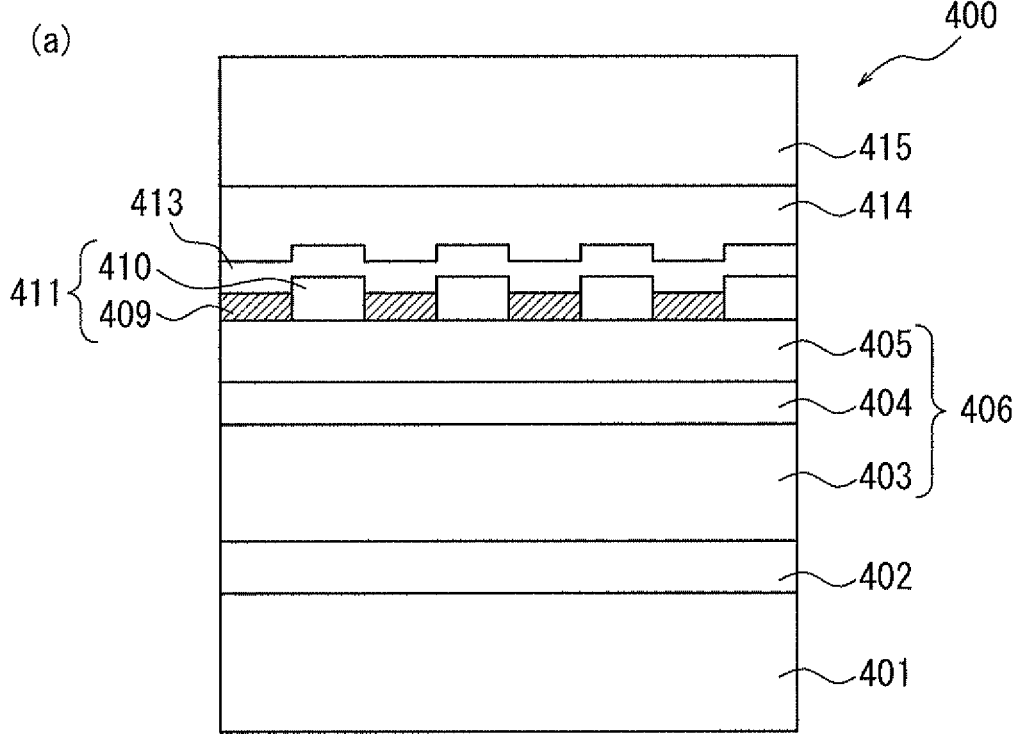
FIGS. 6(a) and 6(b) are schematic cross-sectional views illustrating an example of a production process of another III nitride semiconductor light emitting device 400 (Embodiment 4) according to the present invention.
Figure 6:
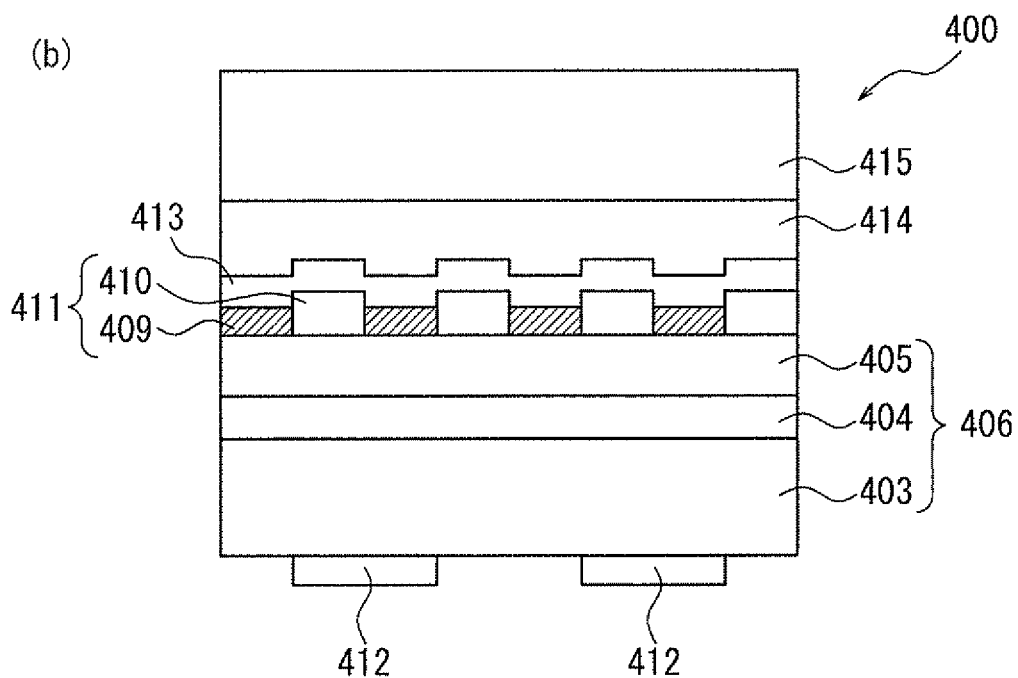

A process of manufacturing a vertical III nitride semiconductor light emitting device 400 will be described as an embodiment of the present invention with reference to FIGS. 6(a) and 6(b). The process up to the step of forming a composite layer 411 is the same as the process shown as a manufacturing method for Embodiment 1 in FIG. 3(f). After that, a p-side electrode 413, a connecting metal layer 414, and a support substrate 415 are sequentially formed on the composite layer 411 as shown in FIG. 6(a).

First, the p-side electrode 413 is formed directly on the composite layer 411 by sputtering, vacuum deposition, or the like.

When the connecting metal layer 414 is bonded to the support substrate, the connecting metal layer 414 is preferably made of a Au-containing material, more preferably, Au or AuSn. When the support substrate 415 is formed on the connecting metal layer 414 by plating, the connecting metal layer 414 is preferably made of noble metals such as Au, Pt, and Pd or a material containing one of Ni and Cu. Further, a metal resistant to the etchant used to separate the substrate 401 by chemical lift-off is desirably selected as the material. Another barrier layer made of a Pt-containing material may be formed between the connecting metal layer 414 and the p-side electrode 413 thereby preventing the diffusion of Au from the connecting metal layer 414.

The support substrate 415 is made of a material with good heat dissipation; for example, a conductive silicon substrate or a substrate made of Mo, W, Ni, or Cu, or an alloy thereof is preferably used. The substrate is selected depending on the resistance to the etchant for subsequent chemical lift-off.

Further, although not shown in FIG. 6(a), the step of connecting the support substrate 415 (FIG. 6(a)) preferably includes sequentially forming a barrier layer made of a Pt-containing material and a support substrate-side connecting layer made of a Au-containing material, on the support substrate 415, and bonding this support substrate-side connecting layer to the connecting metal layer 414.

Then, as shown in FIG. 6(b), the buffer layer 402 is removed by etching or the like, and the substrate 401 is separated from the III nitride semiconductor laminate 106. Subsequently, an n-side electrode 412 is formed on the n-type semiconductor layer 403 which is exposed by the separation. Thus, the vertical III nitride semiconductor light emitting device 400 can be manufactured. Note that in the case of the vertical device, it is necessary to remove the buffer layer 402 as described above; therefore, the buffer layer 402 is preferably composed of a metal material (for example, chromium (Cr), scandium (Sc), hafnium (Hf), zirconium (Zr), or the like) or a nitride of such metals, which can be removed by chemical lift-off.

Each of the above embodiments is only an example of exemplary embodiments, and the present invention is not limited to those embodiments. The present invention will be described below in more detail using examples. However, the present invention is not limited to the following examples.

EXAMPLES

Example 1

An AlN layer (thickness: 27 nm) was formed as an initial layer by MOCVD on an AlN template having an AlN epitaxial layer on the (0001) plane of a sapphire substrate. Then, a superlattice strain buffer layer, an n-type nitride semiconductor layer, a light emitting layer, and a p-type nitride semiconductor layer were epitaxially grown thereon sequentially to form an epitaxial laminate. The laminated structure thus obtained is shown in Table 1. As shown in Table 1, p-GaN was formed to a thickness of 3 nm as an oxidation prevention layer at the top part of the p-type nitride semiconductor layer. The AlN epitaxial layer had a thickness of 800 nm and a dislocation density of $1\times10^{10}$ cm$^{-2}$ or less.

A resist pattern was formed on the p-type nitride semiconductor layer by photolithography, and Ru was sputtered to a thickness of 10 nm. After that, Ru on the resist was removed by removing the resist, thereby forming a reflective electrode portion constituted by 5 µm Ru strips at 5 µm intervals. After surface cleaning by ashing, p-GaN was epitaxially grown as a contact portion to a thickness of 50 nm on the p-type nitride semiconductor layer. The contact portion having a thickness of 50 nm was not grown in the lateral direction on the reflective electrode portion. Thus, a composite layer was formed.

After that, the surface of the n-type nitride semiconductor layer was partially exposed by dry etching to form an n-side electrode (Ti/Al) on the n-type nitride semiconductor layer. A p-side electrode (Ni/Au) was formed on the composite layer. After annealing at 550° C., an electrode pad was formed on each of the p-side electrode and the n-side electrode. Thus, the III nitride semiconductor light emitting device 100 of Embodiment 1, shown in FIG. 1 was manufactured.

Example 2

Figure 4:
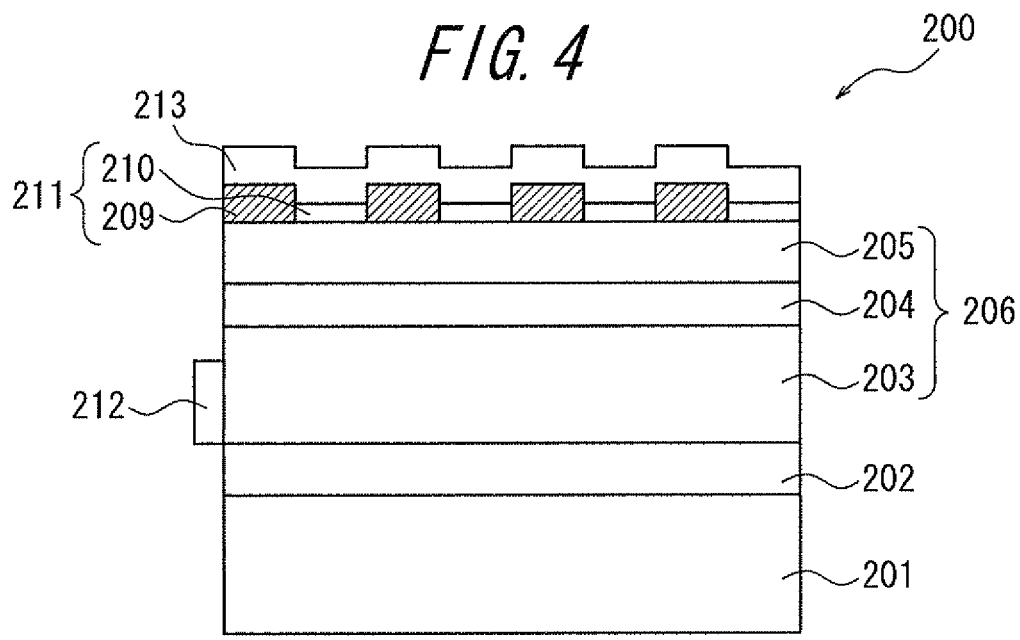
FIG. 4 is a schematic cross-sectional view illustrating another III nitride semiconductor light emitting device 200 (Embodiment 2) according to the present invention.

The III nitride semiconductor light emitting device 200 of Embodiment 2, shown in FIG. 4 was formed by the same method as Example 1 except that the thickness of the reflective electrode portion was 30 nm and the thickness of the contact portion was 20 nm.

Example 3

The III nitride semiconductor light emitting device 300 of Embodiment 3, shown in FIG. 5 was manufactured by the same method as Example 1 except for the following. The thickness of a part of the contact portion without the reflective electrode portion was 200 nm; thus, the contact portion was laterally grown on the reflective electrode portion to cover the reflective electrode portion having a thickness of 10 nm.

Example 4

The III nitride semiconductor light emitting device 100 of Embodiment 1, shown in FIG. 1 was manufactured by the same method as Example 1 except for the following. After forming the Ru film, a SiO$_2$ protective layer (thickness: 10 nm) was additionally formed on the Ru film by sputtering. The protective layer and the Ru film on the resist were removed by removing the resist, thereby forming a reflective electrode portion constituted by 5 µm Ru strips at 5 µm intervals. Further, after forming p-GaN as the contact portion, the SiO$_2$ protective layer was removed using BHF.

Comparative Example 1

Components up to the p-type nitride semiconductor layer were formed to have the same laminated structure as the laminated structure in Table 1 except that the oxidation prevention layer on the top was not formed. After that, a p-type contact layer (p-GaN, thickness: 20 nm) and a reflective electrode layer (Ru, thickness: 10 nm) were sequentially formed on the whole surface of the top of the p-type nitride semiconductor layer. The p-side electrode and the n-side electrode were formed in the same manner as Example 1. Thus, the III nitride semiconductor light emitting device 500 shown in

TABLE 1

| Device structure | | Al content (value of x) | Number of layers (sets) | Thickness per layer (nm) | Total thickness (nm) |
|---|---|---|---|---|---|
| p-type nitride semiconductor layer | Oxidation prevention layer | 0 | 1 | 3 | 3 |
| | p-cladding layer | 0.22 | 1 | 160 | 160 |
| | p-guide layer | 0.22 | 1 | 60 | 60 |
| | p-blocking layer | 0.43 | 1 | 10 | 10 |
| | i-guide layer | 0.17 | 1 | 10 | 10 |
| Light emitting layer | Well layer | 0.15 | 5 | 3 | 15 |
| | i-barrier layer | 0.17 | | 3.3 | 16.5 |
| | n-barrier layer | 0.17 | | 3.3 | 16.5 |
| | i-barrier layer | 0.17 | | 3.3 | 16.5 |
| n-type nitride semiconductor layer | n-guide layer | 0.2 | 1 | 60 | 60 |
| | n-cladding layer | 0.23 | 1 | 300 | 300 |
| | n-contact layer | 0.23 | 1 | 1000 | 1000 |
| | i-surface layer | 0.23 | 1 | 200 | 200 |
| Superlattice strain buffer layer (buffer layer) | Superlattice layer III | 0 | 50 | 2.1 | 105 |
| | | 1 | | 0.9 | 45 |
| | Superlattice layer II | 0 | 30 | 2.1 | 63 |
| | | 1 | | 2.7 | 81 |
| | Superlattice layer I | 0 | 20 | 2.1 | 42 |
| | | 1 | | 9 | 180 |
| AlN initial Saver (buffer layer) | | 1 | 1 | 27 | 27 |

Figure 7:
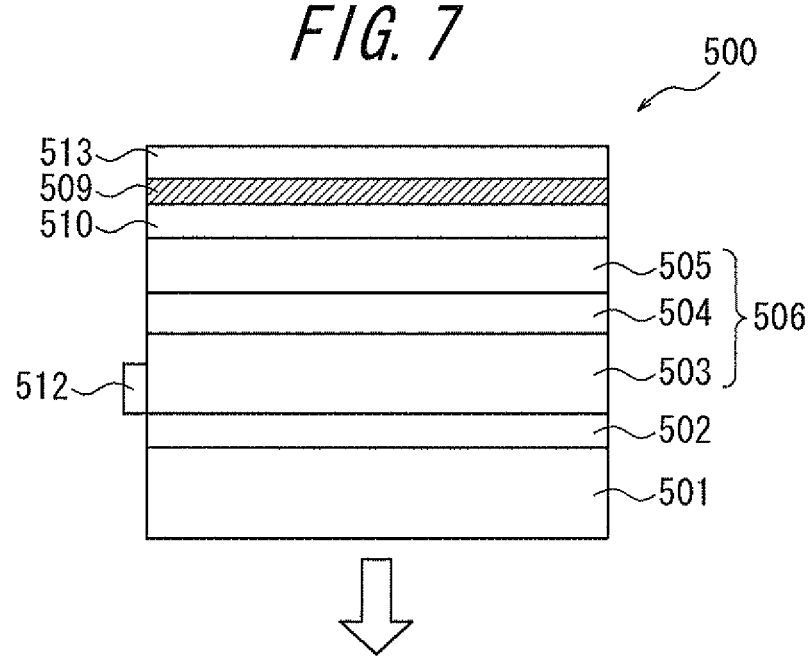
FIG. 7 is a schematic cross-sectional view illustrating a III nitride semiconductor light emitting device 500 according to Comparative Example 1.

FIG. 7 was manufactured. Reference numeral 501 designates a substrate, 502 designates a buffer layer, 503 denotes an n-type semiconductor layer, 504 designates a light emitting layer, 505 designates a p-type semiconductor layer, 506 designates a III nitride semiconductor laminate, 510 designates a p-type contact layer (p-GaN), 509 designates a reflective electrode layer, 512 designates an n-side electrode, and 513 designates a p-side electrode.

Comparative Example 2

Figure 8:
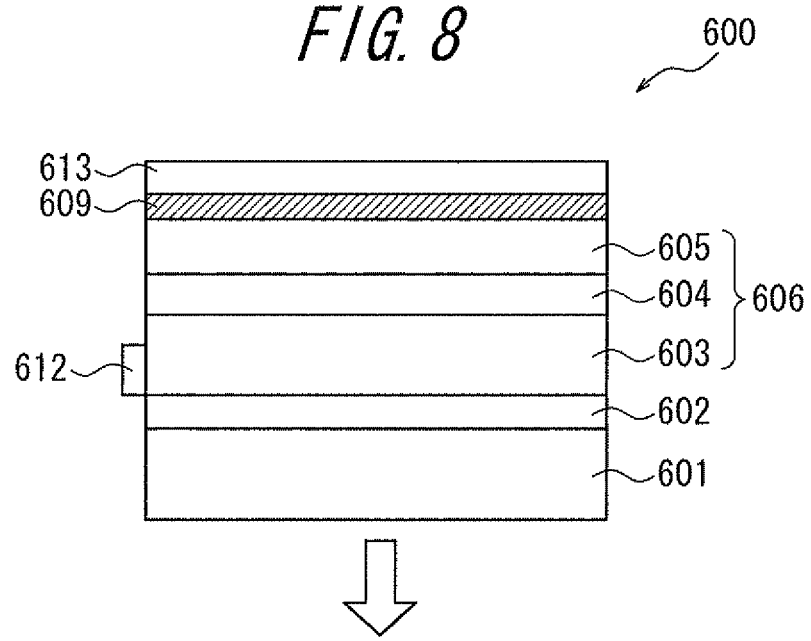
FIG. 8 is a schematic cross-sectional view illustrating a III nitride semiconductor light emitting device 600 according to Comparative Example 2.

The III nitride semiconductor light emitting device 600 shown in FIG. 8 was manufactured by the same method as Comparative Example 1 except that the p-type contact layer (p-GaN) of Comparative Example 1 was not formed. Reference numeral 601 designates a substrate, 602 designates a buffer layer, 603 designates an n-type semiconductor layer, 604 designates a light emitting layer, 605 designates a p-type semiconductor layer, 606 designates a III nitride semiconductor laminate, 609 designates a reflective electrode layer, 612 designates an n-side electrode, and 613 designates a p-side electrode.

Comparative Example 3

Figure 9:
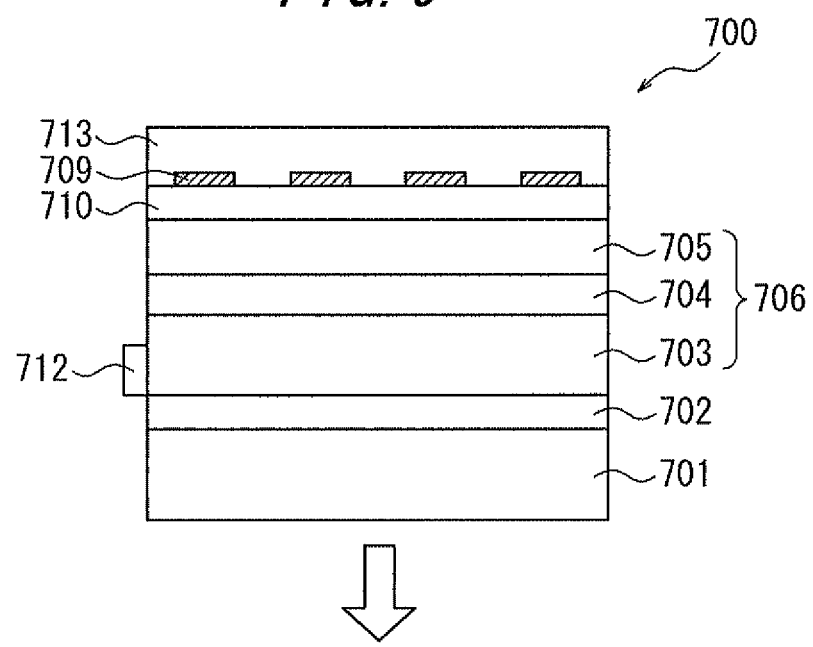
FIG. 9 is a schematic cross-sectional view illustrating a III nitride semiconductor light emitting device 700 according to Comparative Example 3.

Components up to the p-type nitride semiconductor layer were formed to have the same laminated structure as the laminated structure in Table 1 except that the oxidation prevention layer on the top was not formed. After that, a p-type contact layer (p-GaN, thickness: 20 nm) was formed on the whole surface of the top of the p-type nitride semiconductor layer and then a strip-shaped reflective electrode portion (Ru, thickness: 10 nm) was formed as in Example 1. Subsequently, Ni/Au was formed as a p-side electrode on the reflective electrode portion and the exposed p-type contact layer. Thus, the III nitride semiconductor light emitting device 700 shown in FIG. 9 was manufactured. Reference numeral 701 designates a substrate, 702 designates a buffer layer, 703 designates an n-type semiconductor layer, 704 designates a light emitting layer, 705 designates a p-type semiconductor layer, 706 designates a III nitride semiconductor laminate, 710 designates a p-type contact layer, 709 designates a reflective electrode layer, 712 designates an n-side electrode, and 713 designates a p-side electrode.

(Evaluation Method)

The forward voltage Vf at a 20 mA current supplied to the obtained light emitting device by a constant current constant voltage power supply was measured and the light output power Po thereof was measured using an integrating sphere. The measured values were indicated as indices with reference to the values in Comparative Example 1 being 1. The results are shown in Table 2. Higher Po indices indicate excellent characteristics with higher light output power. Lower Vf indices indicate excellent characteristics with lower forward voltage.

TABLE 2

| | Po (INDEX) | Vf (INDEX) |
|---|---|---|
| Example 1 | 1.67 | 0.83 |
| Example 2 | 1.50 | 1.00 |
| Example 3 | 1.67 | 0.83 |
| Example 4 | 1.69 | 0.83 |
| Comparative Example 1 | 1 | 1 |
| Comparative Example 2 | 0.67 | 1.67 |
| Comparative Example 3 | 0.67 | 0.83 |

(Evaluation Result)

As shown in Table 2, in each of Examples 1 to 4, the light output power Po was significantly higher than that in Comparative Example 1 when the forward voltage Vf was as good as or better than that in Comparative Example 1. The highest light output power was obtained in particular in Example 4, since $SiO_2$ positively prevented Ru from being nitrided. On the other hand, in Comparative Example 2, sufficient carrier density was not obtained, since a to p-type contact layer (p-GaN) was not formed. As compared to Comparative Example 1, Vf of Comparative Example 2 was higher, and Po thereof was lower. Thus, both of the characteristics were even worse than Comparative Example 1. Meanwhile, Vf of Comparative Example 3 was lower, whereas Po thereof was lower, as compared to Comparative Example 1.

The examples above show the cases where the reflective electrode has strip-shaped electrodes. However, the same effect was successfully obtained by forming dot-like openings in the reflective electrode portion and growing the p-type contact layer in the openings. The reflective electrode is made of Ru in the examples; however, similar effects were obtained even in cases of using Mo or Rh instead of Ru.

INDUSTRIAL APPLICABILITY

According to the present invention, a composite layer having an reflective electrode portion and a contact portion is formed on a surface of a III nitride semiconductor laminate, opposite to the light extraction side, so that both good ohmic contact between an electrode and a semiconductor layer, and sufficient functionality of the reflective electrode portion can be achieved. Thus, the light emission efficiency can be improved without significantly increasing the forward voltage.

REFERENCE SIGNS LIST

100: III nitride semiconductor light emitting device
101: Substrate
102: Buffer layer
103: n-type semiconductor layer (first conductivity-type semiconductor layer)
104: Light emitting layer
105: p-type semiconductor layer (second conductivity-type semiconductor layer)
106: III nitride semiconductor laminate
107: First surface
108: Second surface
109: Reflective electrode portion
110: Contact portion
111: Composite layer
112: n-side electrode (first electrode)
113: p-side electrode (second electrode)
414: Connecting metal layer
415: Support substrate
116: Protective layer

The invention claimed is:

1. A III nitride semiconductor light emitting device comprising:
  a III nitride semiconductor laminate including a light emitting layer, and a first conductivity-type semiconductor layer and a second conductivity-type semiconductor layer having a conductivity type different from the first conductivity type, the light emitting layer being sandwiched between the first conductivity type semiconductor layer and the second conductivity type semiconductor layer; and a first electrode and a second electrode formed on the first conductivity-type semiconductor layer side and the second conductivity-type semiconductor layer side of the III nitride semiconductor laminate, respectively, wherein a composite layer having a reflective electrode portion and a contact portion made of $Al_xGa_{1-x}N$ ($0 \le x \le 0.05$) is provided on a second surface of the III nitride semiconductor laminate, the second surface being opposite to a first surface on the light extraction side, the contact portion is thicker than the reflective electrode portion, the second electrode is located at the second surface side, and directly contacts the reflective electrode portion and the contact portion, and the reflective electrode portion and the contact portion are located directly on the second surface.

2. The III nitride semiconductor light emitting device according to claim 1, wherein in the composite layer, at least one of the reflective electrode portion and the contact portion is provided to form a plurality of island-shaped regions on the second surface, and the other of reflective electrode portion and the contact portion is provided to be positioned at least between the plurality of the island-shaped regions.

3. The III nitride semiconductor light emitting device according to claim 1, wherein the semiconductor layer having the second surface is p-type, and the reflective electrode portion is made of one of Rh, Pt, Ir, Ru, and Mo or an alloy containing any of these.

4. The III nitride semiconductor light emitting device according to claim 1, wherein the second surface of the III nitride semiconductor laminate is a part of a semiconductor layer made of $Al_xGa_{1-x}N$ ($0 \le x \le 0.05$) with a thickness of 5 nm or less.

5. The III nitride semiconductor light emitting device according to claim 1, wherein the contact portion is formed to cover the reflective electrode portion.

6. A method for manufacturing a III nitride semiconductor light emitting device, comprising the steps of:

forming a buffer layer on a substrate;

forming a III nitride semiconductor laminate by sequentially forming a first conductivity-type semiconductor layer, a light emitting layer, and a second conductivity-type semiconductor layer having a conductivity type different from the first conductivity type, on the buffer layer;

forming a reflective electrode portion directly on a first region of a surface of the III nitride semiconductor laminate on the second conductivity-type semiconductor layer side;

forming a contact portion made of $Al_xGa_{1-x}N$ ($0 \le x \le 0.05$) at least directly on a second region other than the first region, wherein the contact portion is thicker than the reflective electrode portion; and forming a first electrode and a second electrode on the III nitride semiconductor laminate on the first conductivity-type semiconductor layer side and the second conductivity-type semiconductor layer side, respectively, the second electrode directly contacting the reflective electrode portion and the contact portion.

7. The method for manufacturing a III nitride semiconductor light emitting device according to claim 6, further comprising a step of forming a semiconductor layer made of $Al_xGa_{1-x}Ga_{1-x}N$ ($0 \le x \le 0.05$) to a thickness of 5 nm or less on a surface of the III nitride semiconductor laminate, on which the reflective electrode portion and the contact portion are formed.

8. The method for manufacturing a III nitride semiconductor light emitting device according to claim 6, further comprising the steps of:

providing a protective layer on the reflective electrode portion after the step of forming the reflective electrode portion;

then forming the contact layer, and then removing the protective layer.

9. The III nitride semiconductor light emitting device according to claim 1, wherein the composite layer continuously contacts the second surface.

10. The III nitride semiconductor light emitting device according to claim 1, wherein a ratio of a first region in which the reflective electrode portion is formed in the composite layer to a second region in which the contact portion is formed in the composite layer is 0.1 to 10.

11. The III nitride semiconductor light emitting device according to claim 1, wherein the contact portion protrudes into the second electrode.

12. The method for manufacturing a III nitride semiconductor light emitting device according to claim 6, wherein a ratio of the first region on to the second region is 0.1 to 10.

13. The method for manufacturing a III nitride semiconductor light emitting device according to claim 6, wherein the contact portion is formed to protrude into the second electrode relative to the reflective electrode portion.

* * * * *